(12) United States Patent
Kuo et al.

(10) Patent No.: US 10,741,381 B2
(45) Date of Patent: Aug. 11, 2020

(54) CMP CLEANING SYSTEM AND METHOD

(71) Applicant: Taiwan Semiconductor Manufacturing Company, Ltd., Hsinchu (TW)

(72) Inventors: Kaw-Wei Kuo, Tainan (TW); Chun-Hao Kung, Hsinchu (TW); Kuo-Feng Huang, Tainan (TW); Yi-Wei Chiu, Kaohsiung (TW); Wei-Chun Chen, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 320 days.

(21) Appl. No.: 15/602,260

(22) Filed: May 23, 2017

(65) Prior Publication Data

US 2018/0174829 A1     Jun. 21, 2018

Related U.S. Application Data

(60) Provisional application No. 62/434,970, filed on Dec. 15, 2016.

(51) Int. Cl.
*H01L 21/02* (2006.01)
*B08B 1/04* (2006.01)
*B08B 1/00* (2006.01)

(52) U.S. Cl.
CPC ........ *H01L 21/02074* (2013.01); *B08B 1/002* (2013.01); *B08B 1/04* (2013.01); *H01L 21/02065* (2013.01); *B08B 1/008* (2013.01)

(58) Field of Classification Search
None
See application file for complete search history.

(56) References Cited

U.S. PATENT DOCUMENTS

2016/0099156 A1* 4/2016 Yamaguchi ....... H01L 21/67028
438/692

* cited by examiner

*Primary Examiner* — Mikhail Kornakov
*Assistant Examiner* — Pradhuman Parihar
(74) *Attorney, Agent, or Firm* — Slater Matsil, LLP

(57) ABSTRACT

A cleaning apparatus and a method of using the cleaning apparatus are provided. The method includes first moving a pencil pad into contact with a top surface of a wafer, wherein the pencil pad is connected to a pivot arm and second moving the pivot arm in a sweeping motion from a first zone to a second zone, the first zone being closer to a center of the top surface of the wafer than the second zone, wherein the sweeping motion is controlled by a controller, the pivot arm moves at a first speed in the first zone and the pivot arm moves at a second speed in the second zone, wherein the first speed is different from the second speed.

20 Claims, 9 Drawing Sheets

CMP CLEANING SYSTEM AND METHOD

CROSS REFERENCE TO RELATED APPLICATIONS

This application is related to, and claims priority to U.S. Provisional Application No. 62/434,970, titled, "CMP Cleaning System and Method" filed on Dec. 15, 2016, which is herein incorporated by reference.

BACKGROUND

In the manufacturing process of semiconductor devices, an important step is smoothing a surface of a device after it has been made. For example, the formation of various features or layers in a device may cause uneven topography, and this uneven topography may interfere with subsequent manufacturing processes, such as the photolithographic process. It is desirable to planarize the surface of the device, using known methods such as chemical mechanical polish (CMP), after various features or layers have been formed.

During a CMP process, a wafer is placed on a carrier. The carrier and the wafer are then rotated as downward pressure is applied to the wafer against a polishing pad. A chemical solution, referred to as a chemical slurry, is deposited onto the surface of the polishing pad and under the wafer to aid in the planarizing. Thus, the surface of the wafer may be planarized using a combination of mechanical (the grinding) and chemical (the slurry) forces.

After the CMP process has been applied to a wafer, some residues such as carbon or adhesive films and particles may stay on the top surface of the wafer. These films and particles may cause surface roughness leading to defects in subsequent fabrication processes, such as a defect in the photolithography process due to the uneven surface of the wafer.

In order to remove the residues from the wafer, post-CMP cleaning processes may be applied to the wafer. The post-CMP cleaning processes may include a brush cleaning process, a pencil cleaning process and a drying process. During the brush cleaning operation, a brush is brought into contact with the top surface of the wafer. During a relative movement between the brush and the wafer, the contaminants are removed from the wafer surface.

The pencil cleaning process is applied to the wafer after the brush cleaning process. During the pencil cleaning process, a pencil pad is brought into contact with the surface of the wafer. During a relative movement between the pencil pad and the wafer, the remaining contaminants are removed from the wafer surface.

During the brush and pencil cleaning processes, various cleaning liquids may be applied to the wafer and remain on the top surface of the wafer. The remaining liquids may be removed by a spin drying process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
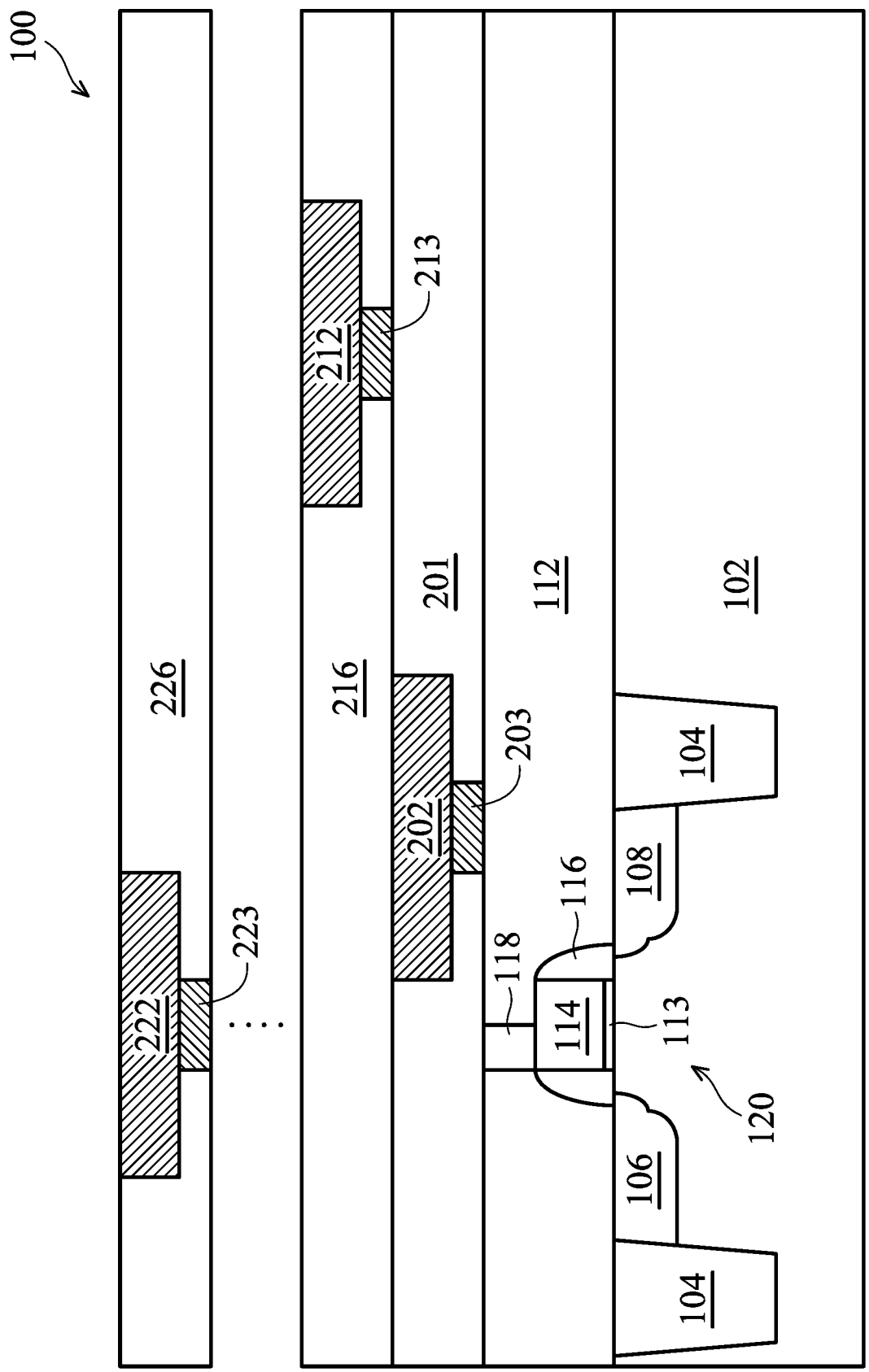
FIG. 1 illustrates a cross sectional view of a semiconductor device in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments in a specific context, namely, a pencil cleaning system and method after a chemical mechanical polish (CMP) process has been applied to a contact plug layer of a wafer. The embodiments of the disclosure may also be applied, however, to a variety of semiconductor manufacturing processes. For example, the system and method may be applicable to a surface of an oxide layer after a CMP process has been applied to the oxide layer. Hereinafter, various embodiments will be explained in detail with reference to the accompanying drawings.

FIG. 1 illustrates a cross sectional view of a semiconductor device in accordance with various embodiments of the present disclosure. The semiconductor device 100 includes a transistor device 120, which is formed in a substrate 102 and a plurality of interconnect structures formed over the substrate 102.

The substrate 102 may be formed of silicon, although it may also be formed of other group III, group IV, and/or group V elements, such as silicon, germanium, gallium, arsenic, and combinations thereof. The substrate 102 may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like.

The substrate 102 may further comprise a variety of electrical circuits (represented in FIG. 1 by transistor device 120). The electrical circuits formed on the substrate 102 may be any type of circuitry suitable for a particular application. In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like. The electrical circuits may be interconnected to perform one or more functions. The functions may include memory structures, processing structures, sensors, amplifiers, power distribution, input/output circuitry and/or the like. One of ordinary skill in the art will appreciate that the above examples are provided for illustrative purposes only and are not intended to limit the various embodiments to any particular applications.

As shown in FIG. 1, there may be isolation regions (e.g., isolation regions 104 illustrated in FIG. 1) formed in the substrate 102 and on opposite sides of the transistor device 120. The isolation regions 104 may be shallow trench isolation (STI) regions. The STI regions may be formed by etching the substrate 102 to form a trench and filling the trench with a dielectric material. For example, the isolation regions 104 may be filled with a dielectric material such as an oxide material, a high-density plasma (HDP) oxide and/or the like. A planarization process such as a CMP process may be applied to the top surface so that the excess dielectric material may be removed as a result.

The transistor device 120 includes a first drain/source region 106 and a second drain/source region 108. The first drain/source region 106 and the second drain/source region 108 are formed on opposite sides of a gate structure of the transistor device 120. The gate structure is formed over the substrate 102. The gate structure may comprise a gate dielectric layer 113, a gate electrode 114 and spacers 116.

The first and second drain/source regions 106 and 108 may be formed in the substrate 102. In an embodiment in which the substrate 102 is an n-type substrate, the first and second drain/source regions 106 and 108 may be formed by implanting appropriate p-type dopants such as boron, gallium, indium and/or the like. Alternatively, in an embodiment in which the substrate 102 is a p-type substrate, the first and second drain/source regions 106 and 108 may be formed by implanting appropriate n-type dopants such as phosphorous, arsenic and/or the like.

The gate dielectric layer 113 may be a dielectric material such as silicon oxide, silicon oxynitride, silicon nitride, an oxide, a nitrogen-containing oxide, a combination thereof and/or the like. The gate dielectric layer 113 may have a relative permittivity value greater than about 4. Other examples of such materials include aluminum oxide, lanthanum oxide, hafnium oxide, zirconium oxide, hafnium oxynitride, any combinations thereof and/or the like. In an embodiment in which the gate dielectric layer 113 comprises an oxide layer, the gate dielectric layer 113 may be formed by suitable deposition processes such as a plasma enhanced chemical vapor deposition (PECVD) process using tetraethoxysilane (TEOS) and oxygen as a precursor. In accordance with an embodiment, the gate dielectric layer 113 may be of a thickness in a range from about 8 Angstroms to about 200 Angstroms.

The gate electrode 114 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof and/or the like. In an embodiment in which the gate electrode 114 is formed of poly-silicon, the gate electrode 114 may be formed by depositing doped or undoped poly-silicon by low-pressure chemical vapor deposition (LPCVD) to a thickness in the range of about 400 Angstroms to about 2,400 Angstroms.

The spacers 116 may be formed by blanket depositing one or more spacer layers (not shown) over the gate electrode 114 and the substrate 102, and performing a suitable etching process to remove horizontal portions of the spacer layers. The spacers 116 may comprise suitable dielectric materials such as SiN, oxynitride, SiC, SiON, oxide and/or the like. The spacers 116 may be formed by, for example, chemical vapor deposition (CVD), PECVD, sputter and/or the like.

The dielectric layer 112 is formed on top of the substrate 102. The dielectric layer 112 may be formed, for example, of a low-K dielectric material, such as carbon containing materials. The dielectric layer 112 may be formed by any suitable method known in the art, such as spinning, CVD and PECVD. It should also be noted that one skilled in the art will recognize while FIG. 1 illustrates a single dielectric layer, the dielectric layer 112 may comprise a plurality of dielectric layers.

As shown in FIG. 1, there may be a contact plug 118 formed in the dielectric layer 112. The contact plug 118 is formed over the gate electrode 114 to provide an electrical connection between the transistor device 120 and the interconnect structures formed over the dielectric layer 112.

The contact plug 118 may be formed by using photolithography techniques to deposit and pattern a photoresist material (not shown) on the dielectric layer 112. A portion of the photoresist is exposed according to the location and shape of the contact plug 118. An etching process, such as an anisotropic dry etch process, may be used to create an opening in the dielectric layer 112.

A conductive material is then filled in the opening. The conductive material may be deposited by using CVD, plasma vapor deposition (PVD), atomic layer deposition (ALD) and/or the like. After the conductive material is deposited in the contact plug opening, excess portions of the conductive material may be removed from the top surface of the dielectric layer 112 by using a planarization process such as CMP. In some embodiments, the conductive material may be copper, tungsten, aluminum, silver, titanium, titanium nitride, tantalum and any combinations thereof and/or the like. In alternative embodiments, in order to reduce the resistance of the contact plug, the contact plug may be formed of cobalt.

A first inter-metal dielectric layer 201 is formed over the dielectric layer 112. As shown in FIG. 1, there may be metal lines and vias formed in the first inter-metal dielectric layer 201 (one metal line 202 and one via 203 being shown in FIG. 1 for illustrative purposes). As shown in FIG. 1, two additional inter-metal dielectric layers 216 and 226 are formed over the first inter-metal dielectric layer 201. In particular, a second metal line 212 and a second via 213 are embedded in a second inter-metal dielectric layer 216, which is similar to the first inter-metal dielectric layer 201. The second metal line 212 and the second via 213 may be formed of metal materials such as copper, copper alloys, aluminum, silver, tungsten, gold, any combinations thereof and/or the like. A third metal line 222 and a third via 223 are similar to the second metal line 212 and the second via 213 respectively, and hence are not discussed to avoid unnecessary repetition.

It should be noted that while FIG. 1 shows two inter-metal dielectric layers 216 and 226 formed over the first inter-metal dielectric layer 201, other embodiments may have more inter-metal dielectric layers (not shown) and the associated metal lines and vias (not shown).

It should further be noted that the metal lines and vias shown in FIG. 1 may be formed by a dual damascene process, although other suitable techniques such as deposition, single damascene may alternatively be used.

Figure 2:
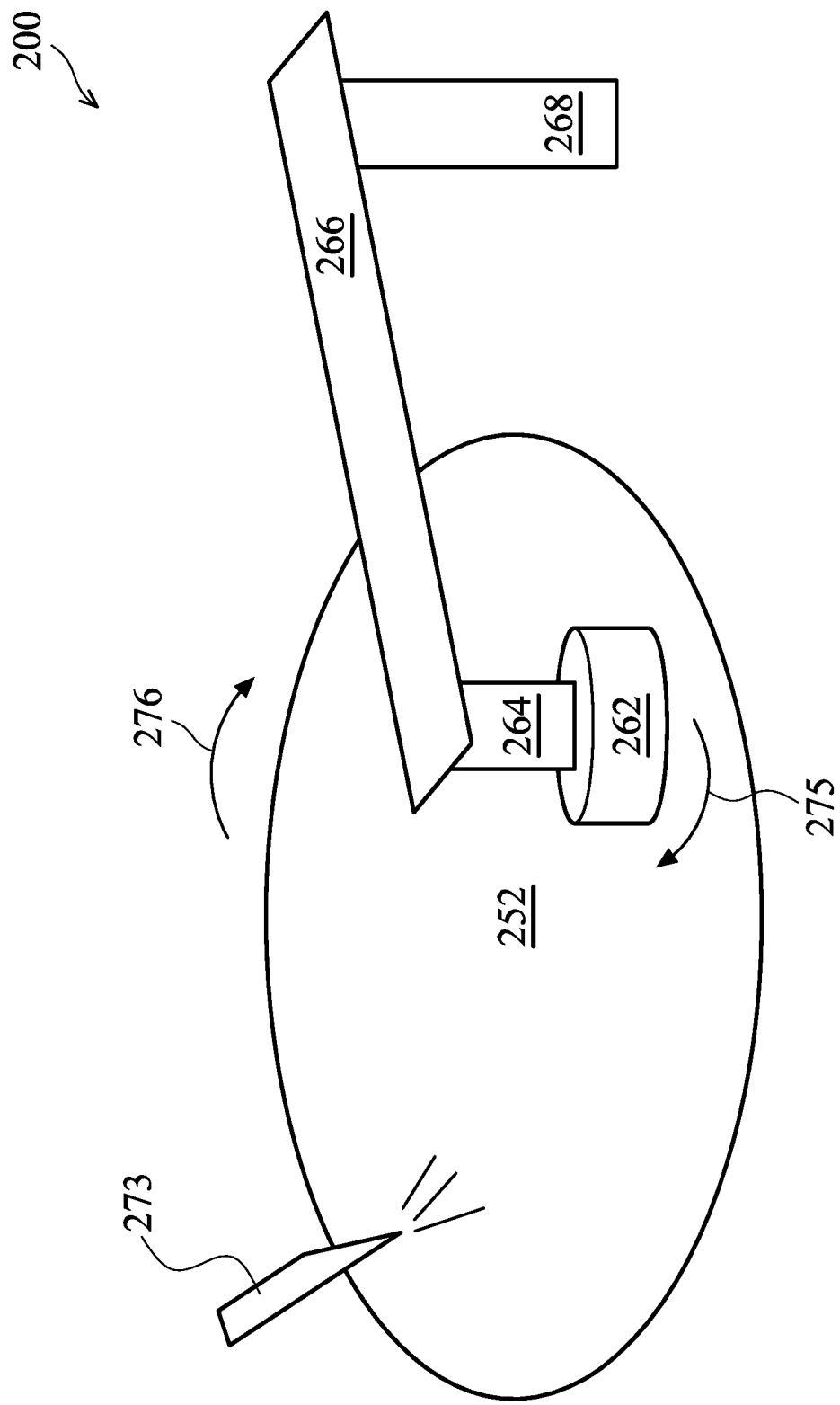
FIG. 2 illustrates a perspective view of a CMP cleaning system in accordance with various embodiments of the present disclosure.

FIG. 2 illustrates a perspective view of a CMP cleaning system in accordance with various embodiments of the present disclosure. The CMP cleaning system 200 includes a rotational drive shaft 268, a pivot arm 266, a pad connector 264 and a rotating pad 262. The rotating pad 262 is alternatively referred to as a pencil pad. The rotational drive shaft 268 is connected to the pencil pad 262 through the pivot arm 266 and the pad connector 264. The rotational drive shaft 268 is able to move the pencil pad 262 in a sweeping motion. A motor and a controller (not shown) is able to rotate the pencil pad 262 in a clockwise direction or in a counterclockwise direction.

As shown in FIG. 2, during a CMP cleaning process, the pencil pad 262 is brought in contact with a top surface of a wafer 252. A nozzle 273 is placed above the wafer 252. The nozzle 273 is employed to supply cleaning liquids.

The wafer 252 may comprise a plurality of transistors and interconnect elements. The structure of the transistors and interconnect elements has been described above in detail with respect to FIG. 1, and hence is not discussed again.

During the fabrication process of the wafer 252, there may be a variety of CMP processes applied to the wafer. For example, during the process of forming the contact plug 118 shown in FIG. 1, a CMP process may be employed to make the top surface of the contact plug 118 level with the top surface of the dielectric layer 112. After the CMP process finishes, the CMP cleaning system shown in FIG. 2 is employed to remove contaminants and the like from the top surface of the wafer 252.

During the cleaning process, the wafer 252 may be rotated in a clockwise direction at a first speed as indicated by arrow 276. In some embodiments, the first speed is in a range from about 500 rpm to about 2000 rpm. The pencil pad 262 may be rotated in a clockwise direction at a second speed as indicated by arrow 275. In some embodiments, the second speed is in a range from about 50 rpm to about 200 rpm.

It should be noted that the rotation directions used in the previous example are selected purely for demonstration purposes and are not intended to limit the various embodiments of the present disclosure to any particular rotation directions and/or speeds. For example, in an alternative embodiment, both the wafer 252 and the pencil pad 262 may be rotated in a counterclockwise direction.

In order to remove contaminants from the top surface of the wafer 252, the pivot arm 266 moves the pencil pad 262 from a center of the top surface of the wafer 252 to an edge of the top surface of the wafer 252 in a sweeping motion. More particularly, the pencil pad 262 sweeps through a plurality of speed zones. The sweeping speed of the pencil pad 262 in a speed zone adjacent to the center of the wafer 252 is greater than the sweeping speed of the pencil pad 262 in a speed zone adjacent to the edge of the wafer 252. The speed zones will be described below in detail with respect to FIGS. 3-5.

In addition, the pivot arm 266 is capable of applying a downward force to the pencil pad 262. In some embodiments, the downward force is in a range from about 0.5 N to about 10 N. In some embodiments, the downward force and the period of applying the downward force to the pencil pad 262 are adjustable. In some embodiments, it is in a range from about 5 seconds to about 40 seconds.

Figure 3:
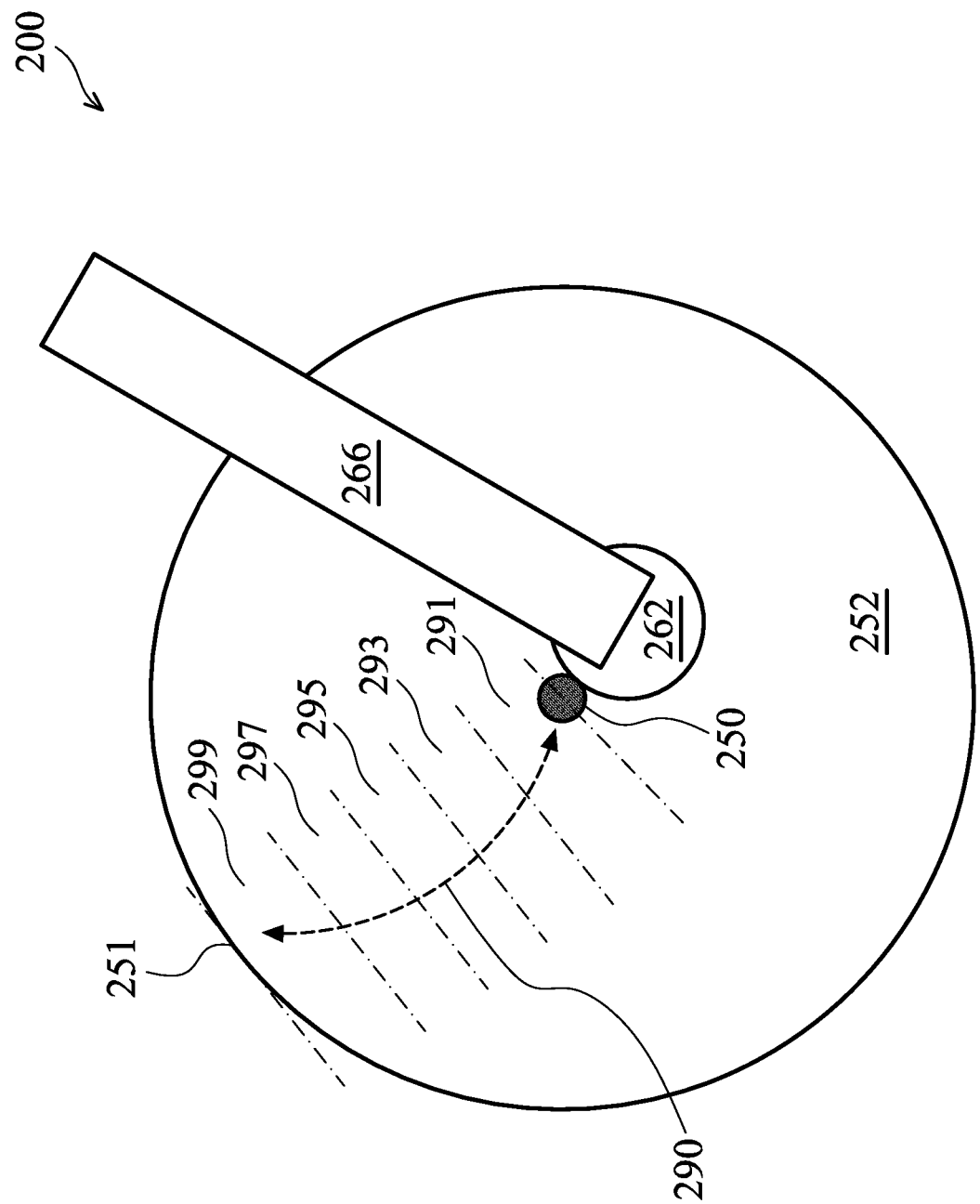
FIG. 3 illustrates a top view of the CMP cleaning system shown in FIG. 2 in accordance with various embodiments of the present disclosure.

FIG. 3 illustrates a top view of the CMP cleaning system shown in FIG. 2 in accordance with various embodiments of the present disclosure. As indicated by the dashed line 290, during the pencil cleaning process applied to the wafer 252, the pivot arm 266 moves the pencil pad 262 in a sweeping motion from a center 250 of the wafer 252 to an edge 251 of the wafer 252.

During the sweeping motion, the sweeping speed of the pivot arm 266 may vary depending on the position of the pencil pad 262 relative to the position on the wafer 252. The sweeping speed gradually reduces as the pencil pad 262 moves from the center 250 to the edge 251. More particularly, the portion of the wafer 252 where the pencil pad 262 sweeps through may be divided into five regions as shown in FIG. 3. In a first region 291, the pivot arm 266 moves the pencil pad 262 at a first sweeping speed. In a second region 293, the pivot arm 266 moves the pencil pad 262 at a second sweeping speed. In a third region 295, the pivot arm 266 moves the pencil pad 262 at a third sweeping speed. In a fourth region 297, the pivot arm 266 moves the pencil pad 262 at a fourth sweeping speed. In a fifth region 299, the pivot arm 266 moves the pencil pad 262 at a fifth sweeping speed.

For example, in some embodiments in which the wafer 252 is a 300 mm wafer, the first sweeping speed is in a range from about 27 mm per second to about 33 mm per second, such as about 30 mm per second. In some embodiments, the second sweeping speed is in a range from about 18 mm per second to about 22 mm per second, such as about 20 mm per second.

In some embodiments, the third sweeping speed is in a range from about 13.5 mm per second to about 16.5 mm per second, such as about 15 mm per second. In some embodiments, the fourth sweeping speed is in a range from about 9 mm per second to about 11 mm per second, such as about 10 mm per second. In some embodiments, the fifth sweeping speed is in a range from about 4.5 mm per second to about 5.5 mm per second, such as about 5 mm per second.

One advantageous feature of having different sweeping speeds during the cleaning process is the speed difference helps to balance the clean times at different regions, thereby reducing the possibility of having contaminants causing defects. For example, when the contact plug is formed of cobalt, the CMP cleaning may cause cobalt corrosion at the center of the wafer 252. More particularly, after a CMP finishes, a water based solution may be used to remove the contaminants on top of the wafer. Cobalt may react with water, thereby causing cobalt losses. By using different speeds discussed above, the clean time at the center of the wafer 252 has been balanced, thereby reducing the cobalt losses at the center of the wafer 252.

It should be noted that the sweeping speeds above are merely an example. Many modifications, variations and alternatives may be used. For example, when the pencil pad 262 moves from a first region 291 to a second region 293, the sweeping speed may jump from one sweeping speed to another sweeping speed. Alternatively, the sweeping speed may gradually change in the first region 291 and the pencil pad 262 reaches the sweeping speed of the second region 293 when entering it without a speed jump. Furthermore, the sweeping speed may change gradually from the center of the wafer 252 to the edge of the wafer 252. Alternatively, the sweeping speed may change in a non-linear manner from the center of the wafer 252 to the edge of the wafer 252.

In addition, the sweeping speed may be fixed from the first region 291 to the fifth region 299. In order to balance the clean times at different regions, the rotation speed of the wafer 252 may be adjusted accordingly. For example, when the pencil pad 262 is in the first region 291, the wafer is of a first rotation speed. When the pencil pad 262 is in the fifth region 299, the wafer is of a second rotation speed. The first rotation speed is greater than the second rotation speed. As a result, the clean times at different regions can be better balanced.

It should further be noted that that the portion of the wafer 252 shown in FIG. 3 may be divided into any number of regions, the five regions shown in FIG. 3 are illustrated for simplicity. While FIG. 3 shows five regions from the center 250 to the edge 251, the method described above (sweeping speed at the center is greater than that at the edge) is applicable to sweeping routes. For example, the method described above is applicable to a cleaning system in which a pivot arm sweeps from the edge to the center or from one edge to the other edge of a wafer.

Furthermore, during the sweeping motion, the downward force applied to the pencil pad 262 from the pivot arm 266 may vary when the pencil pad 262 moves from the center 250 to the edge 251. Such downward force variations may be combined with the speed variation discussed above to further balance the clean times at different regions, thereby reducing the possibility of having cobalt corrosion. Alternatively, the four variables described above, namely the pivot arm sweeping speed, the rotation speed of the pencil pad, the rotation speed of the wafer and the downward force applied to the pencil pad can be adjusted independently to balance the clean times at different regions. In other words, depending on different applications and design needs, the four variables may be adjusted independently or in combination.

Figure 4:
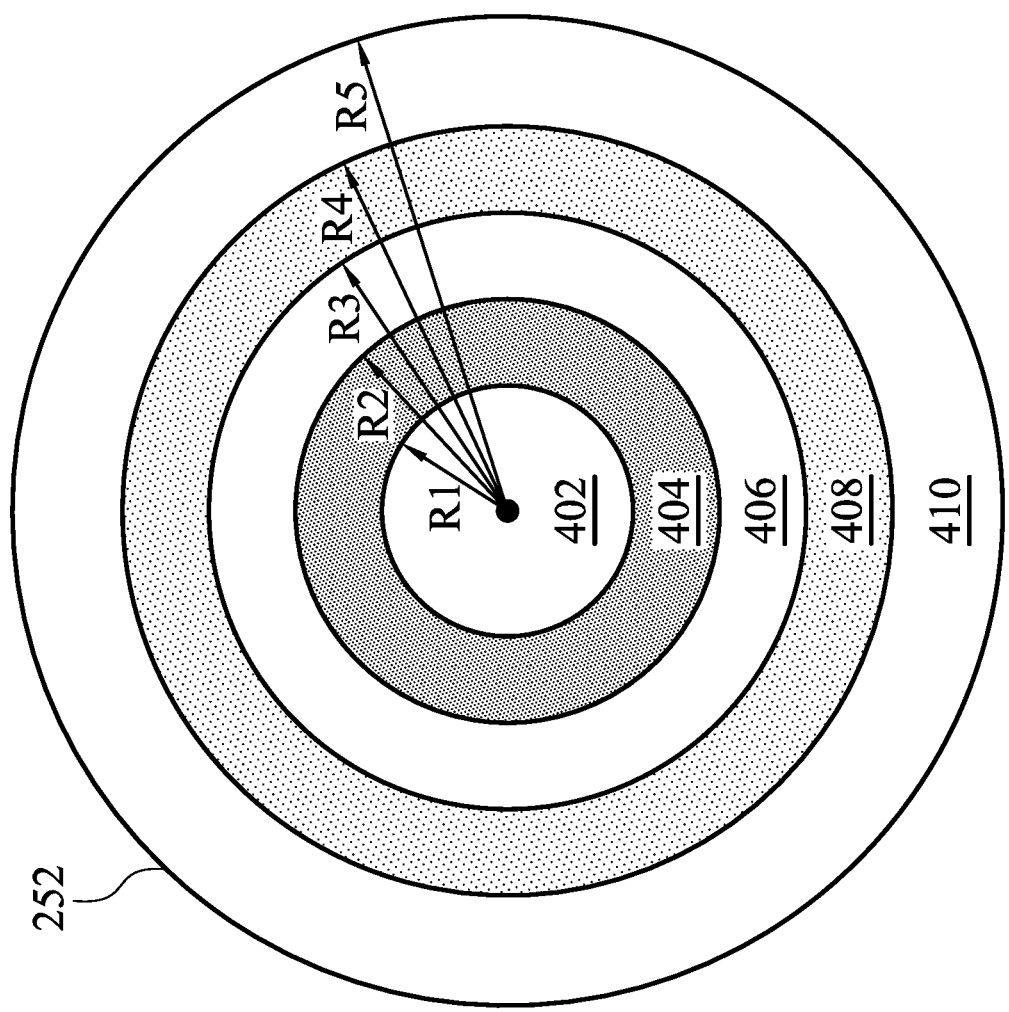
FIG. 4 illustrates a top view of a wafer having a plurality of sweeping speed zones in accordance with various embodiments of the present disclosure.

FIG. 4 illustrates a top view of a wafer having a plurality of sweeping speed zones in accordance with various embodiments of the present disclosure. In order to balance the clean times at different regions of the wafer 252 in a CMP cleaning process, the wafer 252 can be divided into a plurality of sweeping speed zones 402-410 arranged as concentric circles. In some embodiments, the wafer 252 is divided into five sweeping speed zones as shown in FIG. 4. A first sweeping speed zone 402 has a first radius R1. A second sweeping speed zone 404 has a second radius R2. As shown in FIG. 4, R2 is greater than R1. A third sweeping speed zone 406 has a third radius R3. R3 is greater than R2. A fourth sweeping speed zone 408 has a fourth radius R4. R4 is greater than R3. A fifth sweeping speed zone 410 has a fifth radius R5. R5 is greater than R4.

During a sweeping motion of the pencil pad 262 (shown in FIG. 3) through the five sweeping speed zones, the sweeping speed of the pencil pad 262 is not fixed. The detailed sweeping speed profile of the pencil pad 262 will be described below with respect to FIG. 5.

Figure 5:
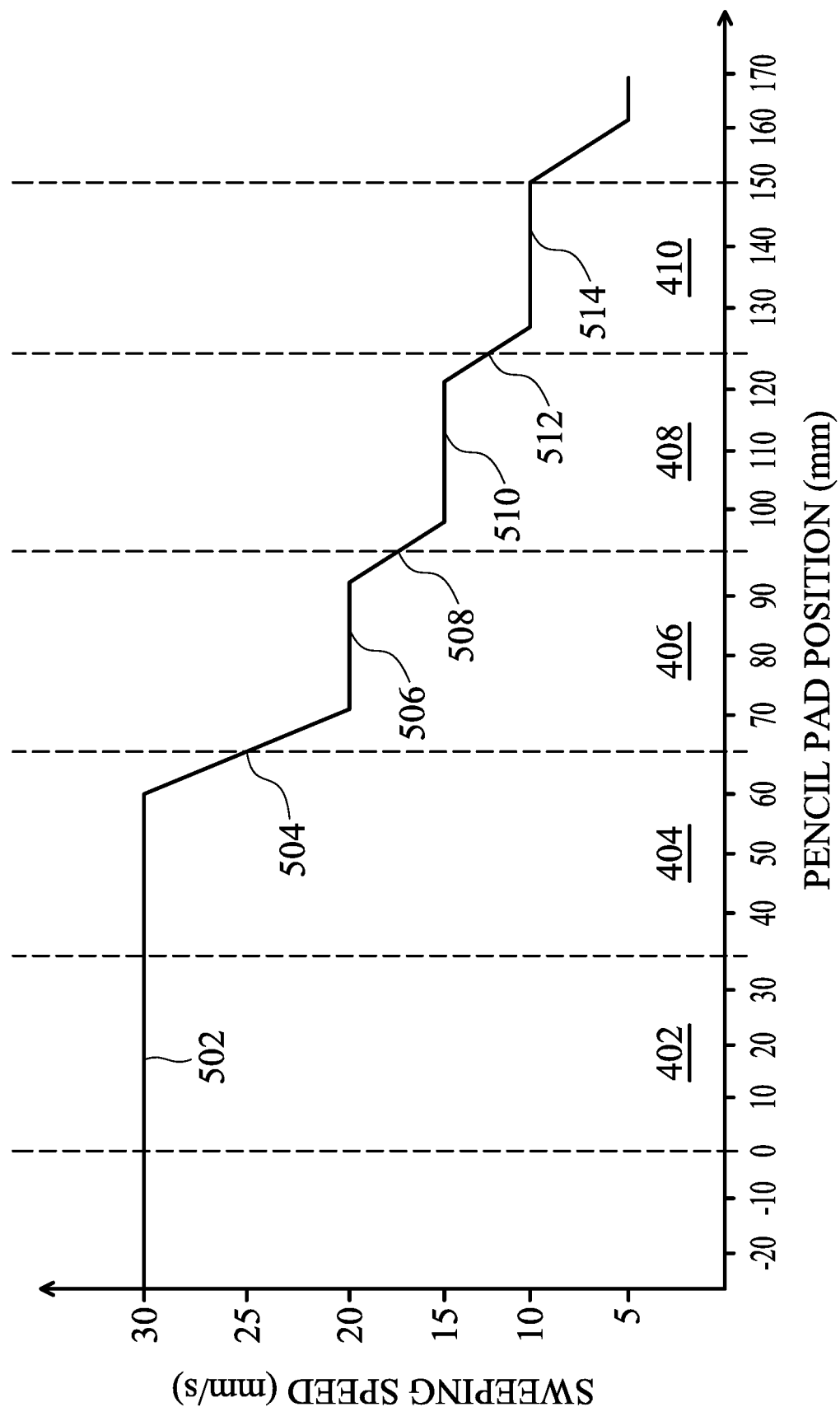
FIG. 5 illustrates a speed profile of a pencil pad in a CMP cleaning system in accordance with various embodiments of the present disclosure.

FIG. 5 illustrates a sweeping speed profile of a pencil pad in a CMP cleaning system in accordance with various embodiments of the present disclosure. The horizontal axis of FIG. 5 represents the distance between a center of the pencil pad 262 (shown in FIG. 3) and a center of the wafer 252 (shown in FIG. 3). The vertical axis represents the sweeping speed of the pencil pad 262, which is in contact with the wafer 252 when the cleaning process is applied to the wafer 252. In accordance with an embodiment, a diameter of the wafer 252 is about 300 mm. The diameter of the pencil pad 262 is about 20 mm.

The portions of the horizontal axis from "−20" to "0" and from "150" to "170" indicate the pencil pad may move beyond the center or the edge during a sweeping motion driven by the pivot arm 266 (shown in FIG. 3).

The first sweeping speed zone 402 is from the center of the wafer 252 to about 35 mm away from the center of the wafer 252. Depending on different design needs, the location of the outermost edge of the first speed zone may vary in a range from about 32 mm away from the center of the wafer 252 to about 37 mm away from the center of the wafer 252. The pencil pad 262 has a first sweeping speed 502 within the first sweeping speed zone 402. In some embodiments, the first sweeping speed 502 is about 27 mm/s to about 33 mm/s, such as 30 mm/s.

The second sweeping speed zone 404 is from the outermost edge of the first sweeping speed zone 402 to about 65 mm away from the center of the wafer. Depending on different design needs, the location of the outermost edge of the second sweeping speed zone 404 may vary in a range from about 60 mm away from the center of the wafer 252 to about 70 mm away from the center of the wafer 252. As shown in FIG. 5, the pencil pad enters the second sweeping speed zone 404 with the first sweeping speed 502. When the pencil pad reaches the region about 60 mm away from the center of the wafer, the speed of the pencil pad starts to drop in a linear manner. As shown in FIG. 5, the sweeping speed of the pencil pad drops from about 30 mm/s to about 20 mm/s when the pencil pad moves from about 60 mm away from the center to about 70 mm away from the center. It should be noted that during the sweeping speed drop process, the pencil pad enters the third sweeping speed zone 406 with a sweeping speed 504 of from about 22.5 mm/s to about 27.5 mm/s, such as about 25 mm/s as shown in FIG. 5.

The third sweeping speed zone 406 is from the outermost edge of the second sweeping speed zone 404 to about 95 mm away from the center of the wafer. Depending on different design needs, the location of the outermost edge of the third sweeping speed zone 406 may vary in a range from about 90 mm away from the center of the wafer 252 to about 100 mm away from the center of the wafer 252. As shown in FIG. 5, the sweeping speed 506 of the pencil pad is from about 18 mm/s to about 22 mm/s, such as about 20 mm/s when the pencil pad is about 70 mm away from the center. In the third speed zone, after reaching the sweeping speed 506 of about 20 mm/s, the pencil pad maintains this speed until the pencil pad reaches the region about 90 mm away from the center of the wafer. Then, the sweeping speed of the pencil pad starts to drop in a linear manner. As shown in FIG. 5, the sweeping speed of the pencil pad drops from about 20 mm/s to about 15 mm/s when the pencil pad moves from about 90 mm away from the center to about 100 mm away from the center. It should be noted that during the sweeping speed drop process, the pencil pad enters the fourth sweeping speed zone 408 with a sweeping speed 508 of from about 16.2 mm/s to about 19.2 mm/s, such as about 18 mm/s as shown in FIG. 5.

As shown in FIG. 5, the fourth sweeping speed zone 408 is from the outermost edge of the third speed zone to about 125 mm away from the center of the wafer. Depending on different design needs, the location of the outermost edge of the third speed zone may vary in a range from about 120 mm away from the center of the wafer 252 to about 130 mm away from the center of the wafer 252. As shown in FIG. 5, the sweeping speed 510 of the pencil pad is from about 13.5 mm/s to about 16.5 mm/s, such as about 15 mm/s when the pencil pad is about 100 mm away from the center. In the fourth speed zone, after the sweeping speed of the pencil pad drops to about 15 mm/s, the pencil pad maintains this sweeping speed until the pencil pad reaches the region about 120 mm away from the center of the wafer. Then, the sweeping speed of the pencil pad starts to drop in a linear manner. As shown in FIG. 5, the sweeping speed of the pencil pad drops from about 15 mm/s to about 10 mm/s when the pencil pad moves from about 120 mm away from the center to about 130 mm away from the center. It should be noted that during the sweeping speed drop process, the pencil pad enters the fifth speed zone with a sweeping speed 512 of from about 11.7 mm/s to about 14.3 mm/s, such as about 13 mm/s as shown in FIG. 5.

As shown in FIG. 5, the fifth sweeping speed zone 410 is from the outermost edge of the fourth sweeping speed zone 408 to about 150 mm away from the center of the wafer. It should be noted that the outermost edge of the wafer is about 150 mm away from the center of the wafer. As shown in FIG. 5, the sweeping speed 514 of the pencil pad is from about 9 mm/s to about 11 mm/s, such as about 10 mm/s when the pencil pad is about 130 mm away from the center. In the fifth sweeping speed zone 410, after the sweeping speed of the pencil pad drops to about 10 mm/s, the pencil pad maintains this sweeping speed until the pencil pad reaches the region about 150 mm away from the center of the wafer. As shown in FIG. 5, the sweeping speed of the pencil pad drops from about 10 mm/s to about 5 mm/s after the pencil pad moves away from the outermost edge of the wafer.

It should be noted that the dimension (e.g., 150 mm from the center to the edge) of the wafer used in FIG. 5 is based on a 300 mm wafer and is selected purely for demonstration purposes and are not intended to limit the various embodiments of the present disclosure to any particular size dimensions. For example, depending on different applications and design needs, the distance from the center to the edge of the wafer may be about 225 mm.

It should further be noted that FIG. 5 is a speed profile illustrating the operation of pencil pad according to an embodiment of the present disclosure. This speed profile shown in FIG. 5 is merely an example, which should not unduly limit the scope of the claims. Many variations, alternatives, and modifications are possible within the scope of the present disclosure. For example, the number of speed zones illustrated herein is limited solely for the purpose of clearly illustrating the inventive aspects of the various embodiments. The present disclosure is not limited to any specific number of speed zones. Additionally, depending on different applications and design needs, the speeding zones may vary. For example, the speed zones shown in FIG. 5 are based upon a 300 mm wafer. When the speed zones described above are applied to other wafers (e.g., 450 mm wafers), the corresponding zone width of each speed zone may vary accordingly. Furthermore, while the speed at each speed zone shown in FIG. 5 is merely an example, the speed may vary depending design needs.

Figure 6:
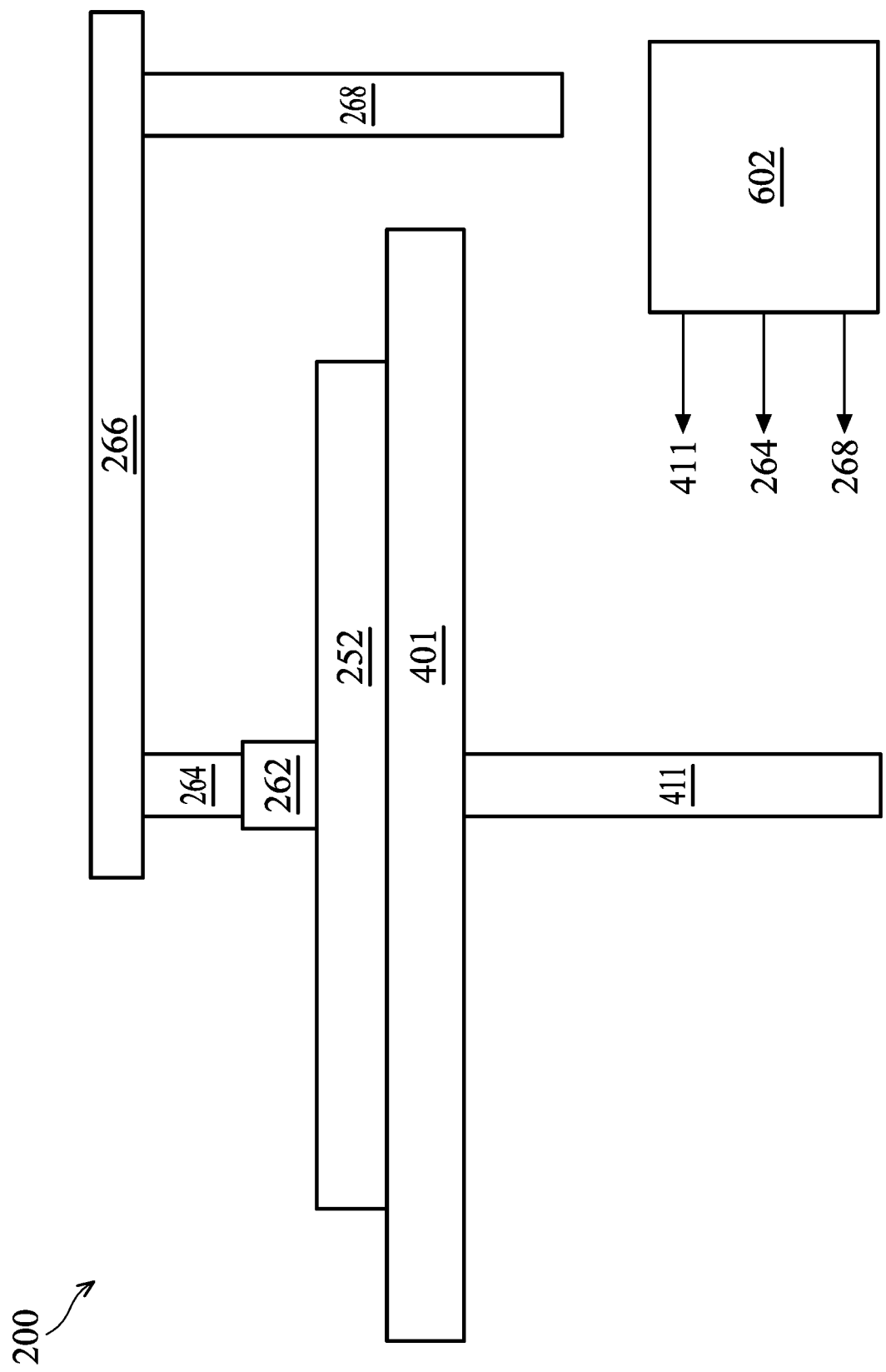
FIG. 6 illustrates a cross sectional view of the CMP cleaning system illustrated in FIG. 2 in accordance with various embodiments of the present disclosure.

FIG. 6 illustrates a cross sectional view of the CMP cleaning system illustrated in FIG. 2 in accordance with various embodiments of the present disclosure. The wafer 252 is placed on a spin chuck 401. In accordance with an embodiment, the backside of the wafer 252 is secured to the spin chuck 401 by, for example, applying vacuum to the backside of the wafer 252 from a plurality of vacuum holders (not shown) of the spin chuck 401.

The backside of the spin chuck is connected to a first rotational drive shaft 411. The bottom surface of the pencil pad 262 is in contact with the top surface of the wafer 252. The pencil pad 262 is connected to the pivot arm 266 through the pad connector 264. The pivot arm 266 is connected to a second rotational drive shaft 268.

During a cleaning process, the spin chuck 401 is used to maintain the wafer 252 on the spin chuck through the plurality of vacuum holders. Furthermore, the spin chuck 401 rotates in a clockwise direction with a first rotation speed. The wafer 252 rotates together with the spin chuck 401. In some embodiments, the first rotation speed is in a range from about 500 rpm to about 2000 rpm. During the cleaning process, the pad connector 264 functions as a rotational drive shaft. The pad connector 264 drives the pencil pad 262 to rotate about its rotational axis simultaneously. In particular, the pencil pad 262 rotates in a clockwise direction with a second rotation speed. In some embodiments, the second rotation speed is in a range from about 50 rpm to about 200 rpm.

Furthermore, during the cleaning process, the pivot arm 266 moves the pencil pad 262 in a sweeping motion from the center of the wafer 252 to the edge of the wafer 252 (see e.g., FIG. 3). The sweeping speed of the pencil pad 262 may vary when the pencil pad 262 sweeps through different speed zones of the wafer 252.

A controller 602 is employed to control the rotation speed of the first rotational drive shaft 411, the rotation speed of the pad connector 264 and the sweeping speed of the pivot arm 266 (through controlling the rotation speed of the rotational shaft 268 illustrated in FIG. 6). The controller 602 may be implemented as a digital controller having a plurality of sensors (not shown). Based upon the sensed signals (e.g., the position of the pencil pad), the controller 602 determines the speeds above accordingly. Alternatively, the controller 602 may comprise a plurality of lookup tables where the predetermined speed profiles are stored. The controller 602 generates the speed control signals based upon the predetermined speed profiles.

Figure 7:
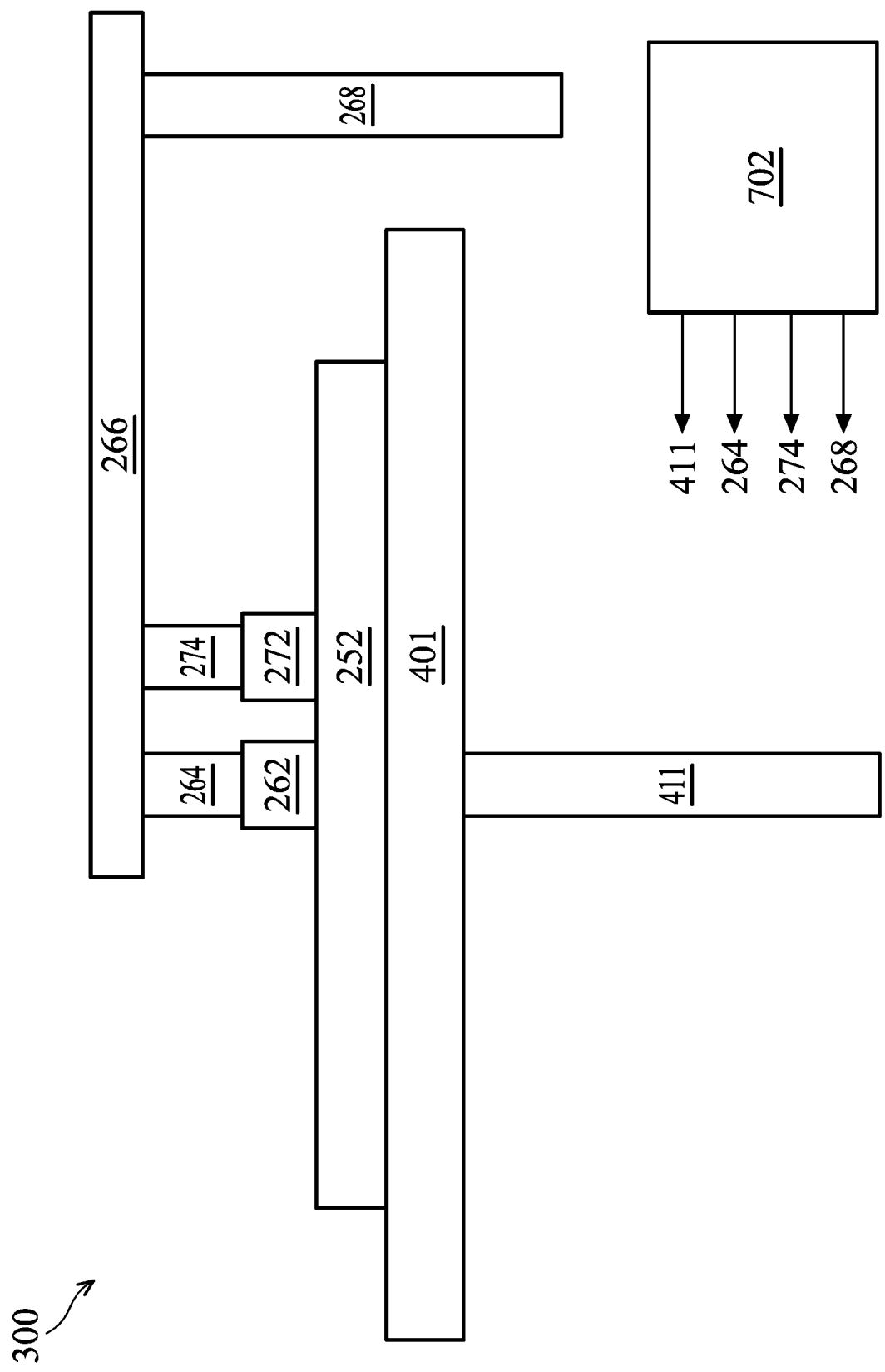
FIG. 7 illustrates a cross sectional view of another CMP cleaning system in accordance with various embodiments of the present disclosure.

FIG. 7 illustrates a cross sectional view of another CMP cleaning system in accordance with various embodiments of the present disclosure. The CMP cleaning system 300 is similar to the CMP cleaning system 200 shown in FIG. 6 except that there are two pencil pads connected to the pivot arm 266. As shown in FIG. 7, a first pencil pad 262 and a second pencil pad 272 are connected to the pivot arm 266 through pad connectors 264 and 274, respectively. The pivot arm 266 moves the first and second pencil pads 262 and 272 in a sweeping motion across the top surface of the wafer 252.

In order to achieve better cleaning loading at different regions of the wafer 252, the rotation speeds of the first and second pencil pads 262 and 272 may be independently controlled. In some embodiments, the first pencil pad 262 is rotated in a first direction with a first rotation speed, and the second pencil pad 272 is rotated in a second direction with a second rotation speed. The first direction may be the same as or opposite of the second direction depending on different applications and design needs.

In some embodiments, the first rotation speed is in a range from about 50 rpm to about 200 rpm. The second rotation speed may be substantially equal to the first rotation speed Depending on different applications and design needs, the first and second rotation speeds may vary accordingly.

Furthermore, the downward forces applied to the first and second pencil pads 262 and 272 may be independently controlled. Moreover, as the first and second pencil pads 262 and 272 move into a new speed zone, the downward forces applied to the first and second pencil pads 262 and 272 may vary depending on design needs.

In some embodiments, the downward force applied to the first pencil pad 262 is in a range from about 0.5 N to about 10 N. The period of applying the downward force to the pencil pad 262 is adjustable. In some embodiments, it is in a range from about 5 seconds to about 40 seconds. The downward force applied to the second pencil pad 272 is substantially equal to the downward force to the pencil pad 262. Depending on different applications and design needs, the downward forces applied to the first and second pencil pads 262 and 272 may vary accordingly.

Each pencil pad shown in FIG. 7 can be independently adjustable. For example, the rotation speed of the pencil pad 272 and the downward force applied to the pencil pad 272 can be adjusted independently according to different design needs. By adjusting the rotation speeds and downward forces of pencil pads 262 and 272, better cleaning loading at different regions of the top surface of the wafer 252 can be achieved.

A controller 702 is employed to control the rotation speed of the first rotational drive shaft 411, the rotation speed of the pad connector 264, the rotation speed of the pad connector 274 and the sweeping speed of the pivot arm 266 (through controlling the rotation speed of the rotational shaft 268 illustrated in FIG. 6). The functions of the controller 702 is similar the controller 602, and hence is not discussed again to avoid repetition.

One advantageous feature of having multiple pencil pads as shown in FIG. 7 is that there are more configurable elements for finer control of the cleaning process at different regions of the top surface of the wafer 252. For example, the sweeping speed of the pivot arm 266, the rotation speeds of the pencil pads 262 and 272, and the downward forces applied to the pencil pads 262 and 272 may be adjusted independently or in combination to give a user more control to achieve better cleaning loading at different regions of the top surface of the wafer 252.

Figure 8:
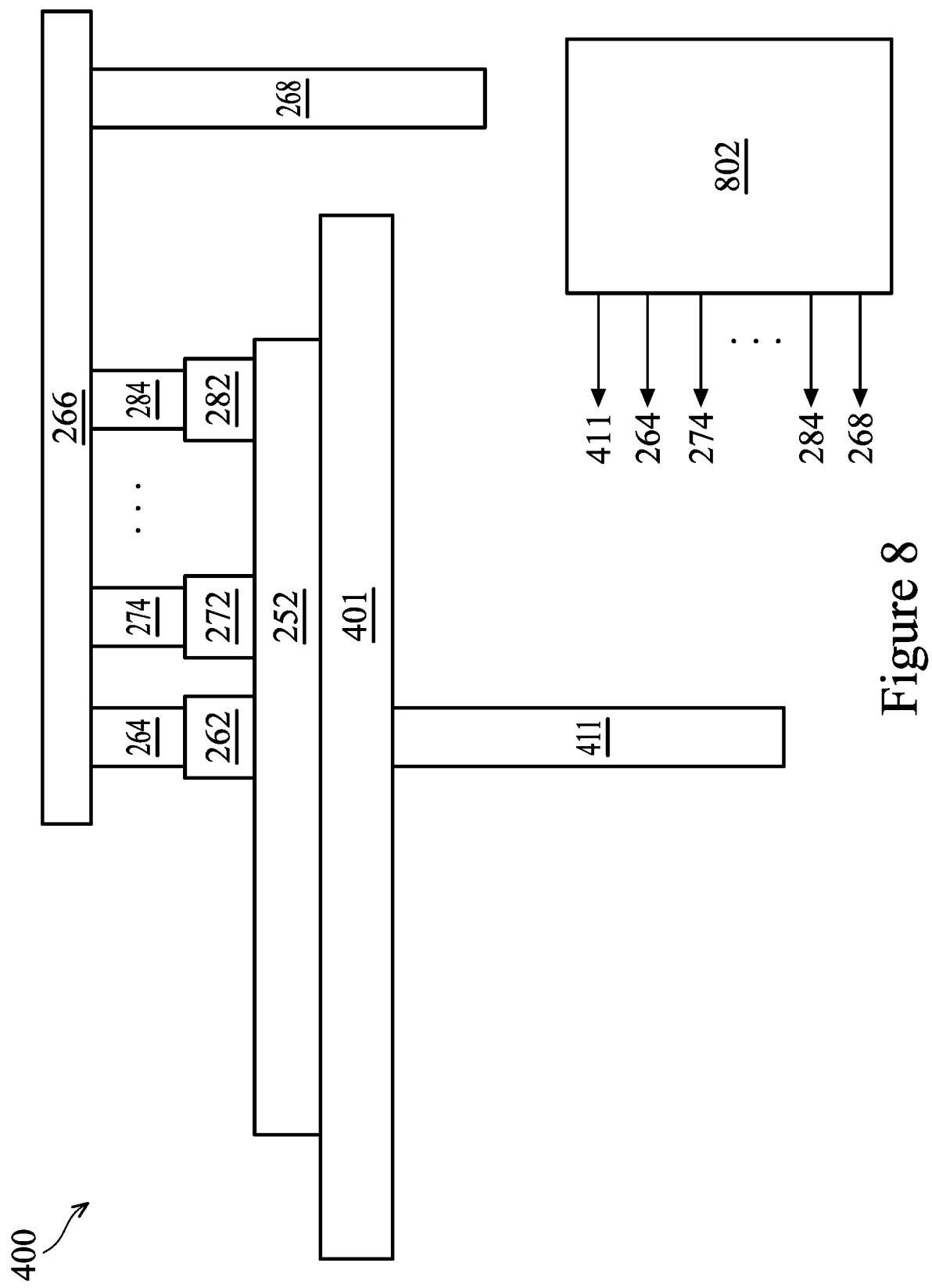
FIG. 8 illustrates a cross sectional view of another CMP cleaning system in accordance with various embodiments of the present disclosure.

FIG. 8 illustrates a cross sectional view of another CMP cleaning system in accordance with various embodiments of the present disclosure. The CMP cleaning system 400 is similar to the CMP cleaning system 300 shown in FIG. 7 except that more than two pencil pads (e.g., pencil pad 282 and its connector 284) are employed to clean the top surface of the wafer 252.

In some embodiments, each pencil pad of FIG. 8 is independently adjustable. For example, the rotation speed and the downward force of each pencil pad can be adjusted independently according to different design needs. By adjusting the rotation speeds and downward forces of pencil pads 262, 272 and 282, better cleaning loading at different regions of the top surface of the wafer 252 can be achieved.

The CMP cleaning system 400 further comprises a controller 802 is employed to control the rotation speed of the first rotational drive shaft 411, the sweeping speed of the pivot arm 266 and the rotation speeds of the a plurality of pad connectors 264, 274 and 284 (through controlling the rotation speed of the rotational shaft 268 illustrated in FIG. 6). The functions of the controller 802 is similar the controller 602, and hence is not discussed again to avoid repetition.

Figure 9:
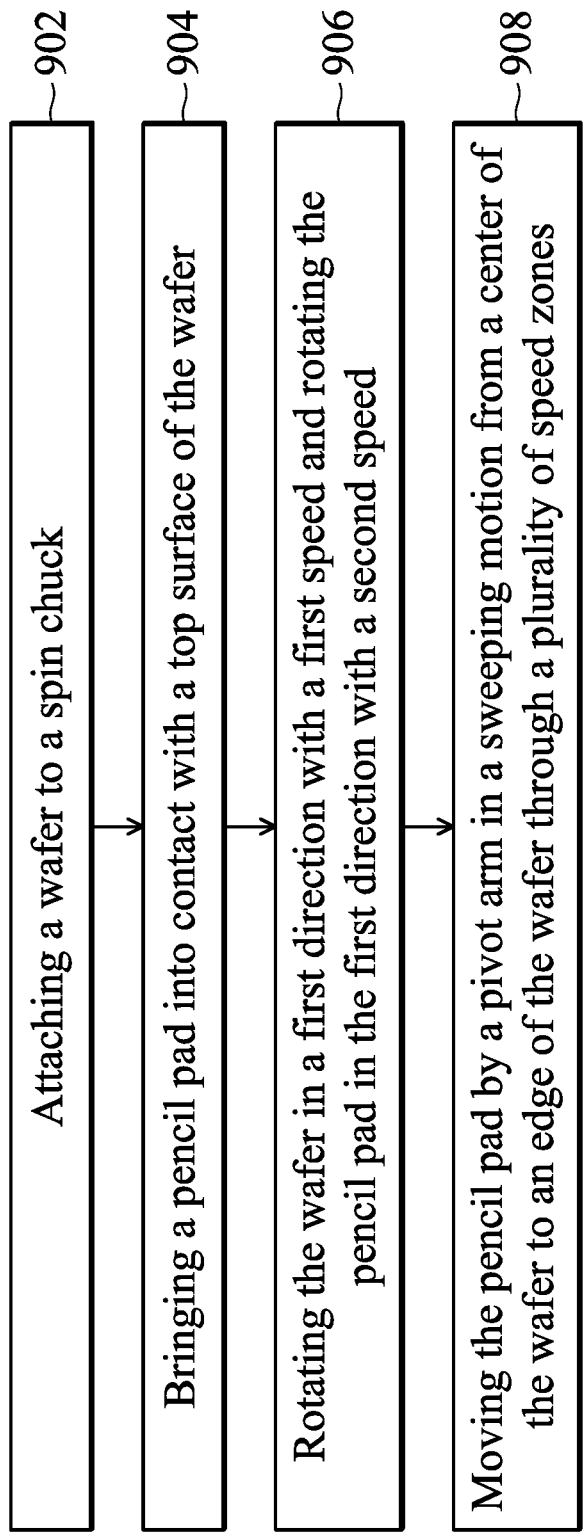
FIG. 9 illustrates a flow chart of a method for cleaning a top surface of a semiconductor device using a pencil pad having different sweeping speeds in accordance with various embodiments of the present disclosure.

FIG. 9 illustrates a flow chart of a method for cleaning a top surface of a semiconductor device using a pencil pad having different sweeping speeds in accordance with various embodiments of the present disclosure. This flowchart shown in FIG. 9 is merely an example, which should not unduly limit the scope of the claims. One of ordinary skill in the art would recognize many variations, alternatives, and modifications. For example, various steps illustrated in FIG. 9 may be added, removed, replaced, rearranged and repeated.

At step 902, a wafer is attached to a spin chuck. The wafer comprises a plurality of transistors. Each transistor comprises a source, a drain and a gate. A contact plug is connected to the gate. In some embodiments, the contact plug is formed of cobalt.

The backside of the spin chuck is connected to a rotational drive shaft. The rotational drive shaft is able to rotate the wafer in a clockwise direction with a rotation speed in a range from, for example, about 500 rpm to about 2000 rpm. Alternatively, the rotational drive shaft is able to rotate the wafer in a counterclockwise direction with a rotation speed in a range from, for example, about 500 rpm to about 2000 rpm.

At step 904, a CMP cleaning system is used to remove contaminants from the top surface of the wafer. The CMP cleaning system includes a rotational drive shaft, a pivot arm connected to the rotational drive shaft and a pencil pad connected to the pivot arm. The pencil pad is brought in contact with the top surface of the wafer. A nozzle may be placed above the wafer. The nozzle is employed to supply cleaning liquids during the process of removing the contaminants from the top surface of the wafer.

At step 906, the rotational drive shaft connected to the spin chuck rotates the wafer in a clockwise direction with a rotation speed in a range from about 500 rpm to about 2000 rpm. The pencil pad rotates in a clockwise direction with a rotation speed in a range from about 50 rpm to about 200 rpm.

At step 908, the rotational drive shaft of the CMP cleaning system moves the pencil pad in a sweeping motion from a center of the top surface of the wafer to an edge of the top surface of the wafer. During the sweeping motion, the pencil pad sweeps through a plurality of speed zones. The sweeping speed of the pencil pad at a zone adjacent to the center of the top surface of the wafer is greater than the sweeping speed of the pencil pad at a zone adjacent to the edge of the top surface of the wafer.

In accordance with an embodiment, a method comprises first moving a pencil pad into contact with a top surface of a wafer, wherein the pencil pad is connected to a pivot arm and second moving the pivot arm in a sweeping motion from a first zone to a second zone, the first zone being closer to a center of the top surface of the wafer than the second zone, wherein the sweeping motion is controlled by a controller, the pivot arm moves at a first speed in the first zone and the pivot arm moves at a second speed in the second zone, and wherein the first speed is different from the second speed.

In accordance with an embodiment, a method comprises moving a first pencil pad into contact with a center of a top surface of a wafer, wherein the first pencil pad is connected to a pivot arm, moving the first pencil pad at a first speed by the pivot arm in a sweeping motion from the center of the top surface of the wafer to a first region of the top surface of the wafer, wherein the sweeping motion is controlled by a controller and moving the first pencil pad at a second speed by the pivot arm in the sweeping motion from the first region of the top surface of the wafer to a second region of the top surface of the wafer, wherein the first speed is different from the second speed.

In accordance with an embodiment, a system comprises a pivot arm connected to a first rotational shaft, a first pencil pad connected to the pivot arm through a second rotational shaft, and wherein the first pencil pad is configured to come into contact with a top surface of a wafer and the pivot arm is configured to move from a first region of the top surface of the wafer to an edge of the top surface of the wafer, and wherein a first sweeping speed of the first pencil pad at the first region of the top surface of the wafer is different from a second sweeping speed of the first pencil pad at the edge of the top surface of the wafer, a controller configured to control rotational speeds of the first rotational shaft and the second rotational shaft and a nozzle configured to apply cleaning liquids to the top surface of the wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   bringing a first pencil pad and a second pencil pad into contact with a top surface of a wafer, wherein the first pencil pad and the second pencil pad are connected to a pivot arm; and
   moving the pivot arm in a sweeping motion from a center of the top surface of the wafer to an outermost edge of the top surface of the wafer, wherein:
   the sweeping motion is controlled by a controller;
   the pivot arm moves at a first sweeping speed at the center of the top surface of the wafer;
   the pivot arm moves at a second sweeping speed at the outermost edge of the top surface of the wafer, the first sweeping speed being different from the second sweeping speed;
   the first pencil pad rotates in a first direction at a first rotation speed, the first rotation speed decreasing as the pivot arm moves in the sweeping motion; and
   the second pencil pad rotates in a second direction at a second rotation speed, the second rotation speed decreasing as the pivot arm moves in the sweeping motion, the first direction being opposite the second direction, the first rotation speed being different from the second rotation speed;
   dividing the top surface of the wafer into a plurality of concentric zones, wherein:
   a first concentric zone is a first concentric circle having a first radius;
   a second concentric zone is a first concentric ring bounded by the first concentric circle and a second concentric circle having a second radius greater than the first radius; and
   a third concentric zone is a second concentric ring bounded by the second concentric circle and a third concentric circle having a third radius greater than the second radius;
   moving the first pencil pad and the second pencil pad by the pivot arm at a third sweeping speed within the first concentric zone;
   moving the first pencil pad and the second pencil pad into the second concentric zone at the third sweeping speed;
   moving the first pencil pad and the second pencil pad into the third concentric zone at a fourth sweeping speed, wherein the third sweeping speed is greater than the fourth sweeping speed; and
   moving the first pencil pad and the second pencil pad at a fifth sweeping speed within the third concentric zone.

2. The method of claim 1, wherein the first sweeping speed is greater than the second sweeping speed.

3. The method of claim 1, wherein a sweeping speed of the pivot arm is reduced from the first sweeping speed to the second sweeping speed at a linear rate.

4. The method of claim 1, wherein:
   the first sweeping speed is in a range from about 28 mm/s to about 2 mm/s; and
   the second sweeping speed in a range from about 22.5 mm/s to about 27.5 mm/s.

5. The method of claim 1 further comprising: rotating the wafer in the first direction at a third rotation speed.

6. The method of claim 5, wherein the third rotation speed is in a range from about 500 rpm to about 2000 rpm.

7. The method of claim 1 further comprising, while moving the pivot arm in the sweeping motion from the center of the top surface of the wafer to the outermost edge of the top surface of the wafer:
   applying a first downward force to the first pencil pad; and
   applying a second downward force to the second pencil pad, the second downward force being different from the first downward force.

8. A method comprising:
   attaching a wafer to a chuck;
   bringing a first pencil pad and a second pencil pad into contact with the wafer while rotating the chuck, the first pencil pad and the second pencil pad being connected to a pivot arm;
   sweeping the pivot arm between a center of the wafer and an outermost edge of the wafer at a sweeping speed;
   while sweeping the pivot arm:
   rotating the first pencil pad in a first direction at a first rotation speed;
   rotating the second pencil pad in a second direction at a second rotation speed, the second direction being opposite the first direction;
   changing the first rotation speed of the first pencil pad at a first rate;
   changing the second rotation speed of the second pencil pad at a second rate, the second rate being different from the first rate; and
   changing the sweeping speed of the pivot arm,
   wherein changing the sweeping speed of the pivot arm comprises:
   dividing a top surface of the wafer into a plurality of concentric zones, wherein:
   a first concentric zone is a first concentric circle having a first radius;
   a second concentric zone is a first concentric ring bounded by the first concentric circle and a second concentric circle having a second radius greater than the first radius; and a third concentric zone is a second concentric ring bounded by the second concentric circle and a third concentric circle having a third radius greater than the second radius;

moving the first pencil pad and the second pencil pad by the pivot arm at a first sweeping speed within the first concentric zone;

moving the first pencil pad and the second pencil pad into the second concentric zone at the first sweeping speed;

moving the first pencil pad and the second pencil pad into the third concentric zone at a second sweeping speed, wherein the first sweeping speed is greater than the second sweeping speed; and moving the first pencil pad and the second pencil pad at a third sweeping speed within the third concentric zone.

9. The method of claim 8, wherein changing the sweeping speed of the pivot arm comprises decreasing the sweeping speed of the pivot arm at a linear rate as the pivot arm sweeps from the center of the wafer to the outermost edge of the wafer.

10. The method of claim 8, wherein changing the sweeping speed of the pivot arm comprises decreasing the sweeping speed of the pivot arm at a non-linear rate as the pivot arm sweeps from the center of the wafer to the outermost edge of the wafer.

11. The method of claim 8, wherein decreasing the sweeping speed of the pivot arm comprises decreasing the sweeping speed of the pivot arm from 30 mm/s to 5 mm/s as the pivot arm sweeps from the center of the wafer to the outermost edge of the wafer.

12. The method of claim 8, wherein the first rotation speed and the second rotation speed are each in a range of 50 rpm to 200 rpm.

13. The method of claim 8, wherein changing the first rotation speed of the first pencil pad comprises decreasing the first rotation speed of the first pencil pad as the pivot arm sweeps from the center of the wafer to the outermost edge of the wafer, and wherein changing the second rotation speed of the second pencil pad comprises decreasing the second rotation speed of the second pencil pad as the pivot arm sweeps from the center of the wafer to the outermost edge of the wafer.

14. The method of claim 8, wherein sweeping the pivot arm comprises rotating a drive shaft, a distance between the first pencil pad and the drive shaft being greater than a distance between the second pencil pad and the drive shaft.

15. The method of claim 8 further comprising, while sweeping the pivot arm:
applying a first downward force to the first pencil pad; and
applying a second downward force to the second pencil pad, the second downward force being different from the first downward force.

16. The method of claim 15 further comprising:
decreasing the first downward force and the second downward force as the pivot arm sweeps from the center of the wafer to the outermost edge of the wafer.

17. A method comprising:
bringing a first pencil pad and a second pencil pad into contact with a top surface of a wafer, wherein the first pencil pad and the second pencil pad are connected to a pivot arm; and
moving the first pencil pad and the second pencil pad by the pivot arm in a sweeping motion from a center of the wafer to a first region of the wafer, wherein:
the first pencil pad and the second pencil pad each move at a first sweeping speed at the center of the wafer;
the first pencil pad and the second pencil pad each move at a second sweeping speed in the first region of the wafer, the first sweeping speed being greater than the second sweeping speed;
the first pencil pad and the second pencil pad rotate at a first rotation speed at the center of the wafer;
the first pencil pad and the second pencil pad each move at a second rotation speed in the first region of the wafer, the first rotation speed being greater than the second rotation speed;
dividing the top surface of the wafer into a plurality of concentric zones, wherein:
a first concentric zone is a first concentric circle having a first radius;
a second concentric zone is a first concentric ring bounded by the first concentric circle and a second concentric circle having a second radius greater than the first radius; and
a third concentric zone is a second concentric ring bounded by the second concentric circle and a third concentric circle having a third radius greater than the second radius;
moving the first pencil pad and the second pencil pad by the pivot arm at a third sweeping speed within the first concentric zone;
moving the first pencil pad and the second pencil pad into the second concentric zone at the third sweeping speed;
moving the first pencil pad and the second pencil pad into the third concentric zone at a fourth sweeping speed, wherein the third sweeping speed is greater than the fourth sweeping speed; and
moving the first pencil pad and the second pencil pad at a fifth sweeping speed within the third concentric zone.

18. The method of claim 17 further comprising:
after entering the second concentric zone at the third sweeping speed, reducing a sweeping speed of the first pencil pad and the second pencil pad from the third sweeping speed to the fifth sweeping speed.

19. The method of claim 17, wherein:
the wafer rotates at a third rotation speed when the first pencil pad and the second pencil pad are at the center of the wafer; and
the wafer rotates at a fourth rotation speed when the first pencil pad and the second pencil pad are in the first region of the wafer, the third rotation speed being greater than the fourth rotation speed.

20. The method of claim 17, wherein the first rotation speed and the second rotation speed are each in a range of 50 rpm to 200 rpm.

* * * * *

UNITED STATES PATENT AND TRADEMARK OFFICE
CERTIFICATE OF CORRECTION

PATENT NO. : 10,741,381 B2
APPLICATION NO. : 15/602260
DATED : August 11, 2020
INVENTOR(S) : Kaw-Wei Kuo et al.

It is certified that error appears in the above-identified patent and that said Letters Patent is hereby corrected as shown below:

In the Claims

In Column 14, Line 23, Claim 4, delete "2 mm/s" and insert --32 mm/s--.

Signed and Sealed this
Tenth Day of November, 2020

Andrei Iancu
*Director of the United States Patent and Trademark Office*